(12) United States Patent  
Crewe

(10) Patent No.: US 6,633,034 B1  
(45) Date of Patent: Oct. 14, 2003

(54) METHOD AND APPARATUS FOR IMAGING A SPECIMEN USING LOW PROFILE ELECTRON DETECTOR FOR CHARGED PARTICLE BEAM IMAGING APPARATUS INCLUDING ELECTROSTATIC MIRRORS

(75) Inventor: David A. Crewe, Long Grove, IL (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/565,585

(22) Filed: May 4, 2000

(51) Int. Cl.[7] ............................................... H01J 37/26
(52) U.S. Cl. ...................... 250/310; 250/305; 250/281; 250/282; 250/294; 250/296; 250/297; 250/396 R; 250/397; 313/103 CM; 313/104; 313/105 CM; 313/399
(58) Field of Search ................................. 250/310, 305, 250/396 R, 281, 282, 294, 297; 313/103 CM, 105 CM, 399, 104

(56) References Cited

U.S. PATENT DOCUMENTS

| | | | | |
|---|---|---|---|---|
| 3,714,424 A | * | 1/1973 | Weber ......................... | 250/310 |
| 3,714,425 A | * | 1/1973 | Someya et al. ............. | 250/311 |
| 4,810,883 A | * | 3/1989 | Turner ......................... | 250/281 |
| 4,958,079 A | * | 9/1990 | Gray ........................... | 250/305 |
| 5,319,207 A | * | 6/1994 | Rose et al. ................. | 250/396 R |
| 5,466,940 A | | 11/1995 | Litman ........................ | 250/397 |
| 5,644,132 A | | 7/1997 | Litman ........................ | 250/310 |

OTHER PUBLICATIONS

H. Nishimura, "Apparatus and Method for Defect Detection Using Charged Particle Beam", Pub. No: US 2002/0005484, published Jan. 17, 2002.*

* cited by examiner

Primary Examiner—John R. Lee  
Assistant Examiner—Zia R. Hashmi  
(74) Attorney, Agent, or Firm—Sughrue Mion LLP.

(57) ABSTRACT

A charged particle beam method and apparatus use a primary electron beam to irradiate a specimen so as to induce the specimen to emit secondary and backscattered electrons carrying information about topographic and material structure of the specimen, respectively. The specimen may be an article to be inspected. The electrons emitted by the specimen are deflected in the electric field of an electron mirror and detected using an electron detector of the apparatus. The electron mirror permits the detection of the secondary electrons traveling close to the optical axis of the apparatus and corrects the aberrations of the secondary electrons. In addition, the electron mirror accelerates the electrons improving the detection efficiency of the electron detector and enhancing the time-of-flight dispersion characteristics of the secondary electron collection. A second electron mirror can be provided to further control the direction of the electron's landing on the surface of the electron detector.

36 Claims, 8 Drawing Sheets

Source Lens  Deflectors  Mirror  Guide  Einzel lens

METHOD AND APPARATUS FOR IMAGING A SPECIMEN USING LOW PROFILE ELECTRON DETECTOR FOR CHARGED PARTICLE BEAM IMAGING APPARATUS INCLUDING ELECTROSTATIC MIRRORS

BACKGROUND OF THE INVENTION

1. Field of the Invention

This invention relates to imaging a specimen using charged particle beam imaging devices. In particular, the invention relates to the design of charged particle detectors for article imaging devices that utilize charged particle beams. More specifically, the invention relates to the design of low-profile electron detectors for charged particle beam imaging devices.

2. Description of the Related Art

In a conventional charged particle beam apparatus, a specimen under inspection is irradiated using a primary electron beam. The interaction of the primary electron beam with the specimen causes the latter to emit electrons with kinetic energies ranging between zero electron-volts (eV) and the kinetic energy of the electrons in the primary beam.

The electrons emitted by the specimen are classified according to their initial kinetic energies. The first group of electrons with kinetic energies of up to 50 eV are called secondary electrons, or secondaries. The secondary electrons emitted by the specimen typically carry the information about the topographical structure of the specimen.

The interaction of the primary electron beam with the specimen also causes the emission of the second class of electrons, called backscattered electrons. The backscattered electrons have energies ranging from 50 eV and up to the kinetic energy of the electrons in the primary electron beam and carry information about the material composition of the specimen.

The secondary and backscattered electrons emitted by the specimen are collected using an electron detector. It should be noted that most of the existing electron detectors are capable of detecting only electrons with kinetic energies included in a predetermined detection energy range. In addition, the detection efficiency (the ratio of the number of detected electrons to the total number of secondary electrons emitted from the specimen) may depend on the electron energy. Accordingly, in order to detect the secondary and backscattered electrons with higher efficiency, their kinetic energies can be further increased. Typically, this is accomplished by accelerating the electrons in the electric field of the particle beam apparatus. The aforementioned accelerating electric field can be produced by biasing the surface of the specimen and the surface of the electron detector, such as to create a suitable electric potential difference therebetween.

The electron detector collects the electrons emitted by the specimen and generates an output electrical signal representative of the cumulative charge of the collected electrons, multiplied by the amplification factor of the detector. The electric signal produced by the electron detector is used in creating an image of the specimen. Depending on the nature of the electrons used in imaging (secondary or backscattered), the created image is indicative of either the topographic or material structure of the specimen. After the image of the area of the specimen irradiated by the primary beam spot is created using the secondary and/or backscattered electrons, the specimen is moved with respect to the irradiating primary electron beam so that the particle beam apparatus can produce an image of the next area. The specimen can be moved in a continuous or stepwise manner.

Unfortunately, the secondary and backscattered electrons emitted by the specimen typically have a wide kinetic energy distribution. Therefore, the amount of time required for various electrons to reach the electron detector of the column varies substantially. A wide dispersion in the arrival times of the secondary electrons emitted from the specimen results in a decrease of the scanning speed of the particle beam apparatus because the apparatus has to "wait" for the slowest electrons emitted by the irradiated spot of the specimen to reach the detector, before it can move on to scan the next spot. Because the width of the collection time distribution is proportional to the average electron travel time, it is highly advantageous to minimize the electron travel time by accelerating electrons in an electric field.

Various electron detection schemes for electron beam imaging systems have been developed. One of these recently developed methods is an indirect electron detection scheme. For example, one type of Applied Materials scanning electron microscope (SEM) column uses indirect detection whereby secondary electrons emitted from the specimen first strike a conical structure near the face of a micro channel plate (MCP) detector. Secondary electrons generated on the cone are attracted to the face of the MCP via an electric field. This design allows for the collection of secondary electrons that are close to the optic axis, thus presenting a challenge in using an MCP detector since a small aperture (typical MCPs are limited to not less than 0.3 mm) is difficult to manufacture in this type of detector.

An indirect electron detection concept also is known in which electrons emitted from the specimen first strike a target electrode having a small aperture and newly-generated electrons (tertiary electrons) are accelerated toward a rear facing detector, such as a micro channel plate detector (MCP). The use of the target permits directing the tertiary electrons away from the optical axis of the apparatus. Therefore, the system is capable of efficient detection of the electrons traveling close to the optical axis. In addition, the tertiary electrons land over a relatively wide area on the surface of the electron detector, which improves the detector's aging characteristics. However, it is desirable in the charged particle beam apparatus to further accelerate the electrons before detecting and to correct the aberration of the secondary electron beam.

Pursuant to the foregoing discussion, there is a strong and widely recognized need for, and it would be highly advantageous to have an improved charged particle beam apparatus that would provide for higher electron landing energies, would correct aberration of the secondary electron beam, and would provide for efficient detection of secondary electrons traveling close to the optical axis.

SUMMARY OF THE INVENTION

It is therefore one feature of the invention to overcome the above shortcomings of known techniques by providing an improved charged particle beam apparatus yielding higher electron landing energies, correcting aberration of the secondary electron beam, and efficiently detecting secondary electrons traveling close to the optical axis.

To achieve the above and other features and realize the benefits and advantages of the invention, there is provided a method and system for imaging a specimen in a charged particle beam apparatus using an electron mirror.

According to the inventive method, the specimen is induced to emit electrons. This can be done, for example, by irradiating the specimen with a primary electron beam. The inventive method further comprises deflecting the emitted electrons in a field of an electron mirror and detecting the emitted electrons.

Another aspect of the present invention is a charged particle beam apparatus using an electrostatic mirror. The inventive apparatus comprises an electron beam generation and transport system for providing a primary electron beam. The primary electron beam irradiates the specimen and induces the specimen to emit electrons. The apparatus also includes an electron mirror for deflecting emitted electrons and an electron detector for detecting the deflected emitted electrons to create an image of the specimen.

Further improvements include providing a primary electron beam shield for shielding the primary electron beam and the emitted electrons from the electric field of the electron mirror.

Still further improvements include providing a second electron mirror for controlling the landing direction of the emitted electrons on the surface of the electron detector.

BRIEF DESCRIPTION OF THE DRAWINGS

These and other features and benefits of the invention will be readily appreciated in the light of the following detailed description of preferred embodiments thereof, given by way of example only with reference to the accompanying drawings wherein.

DETAILED DESCRIPTION OF PREFERRED EMBODIMENTS

Figure 1:
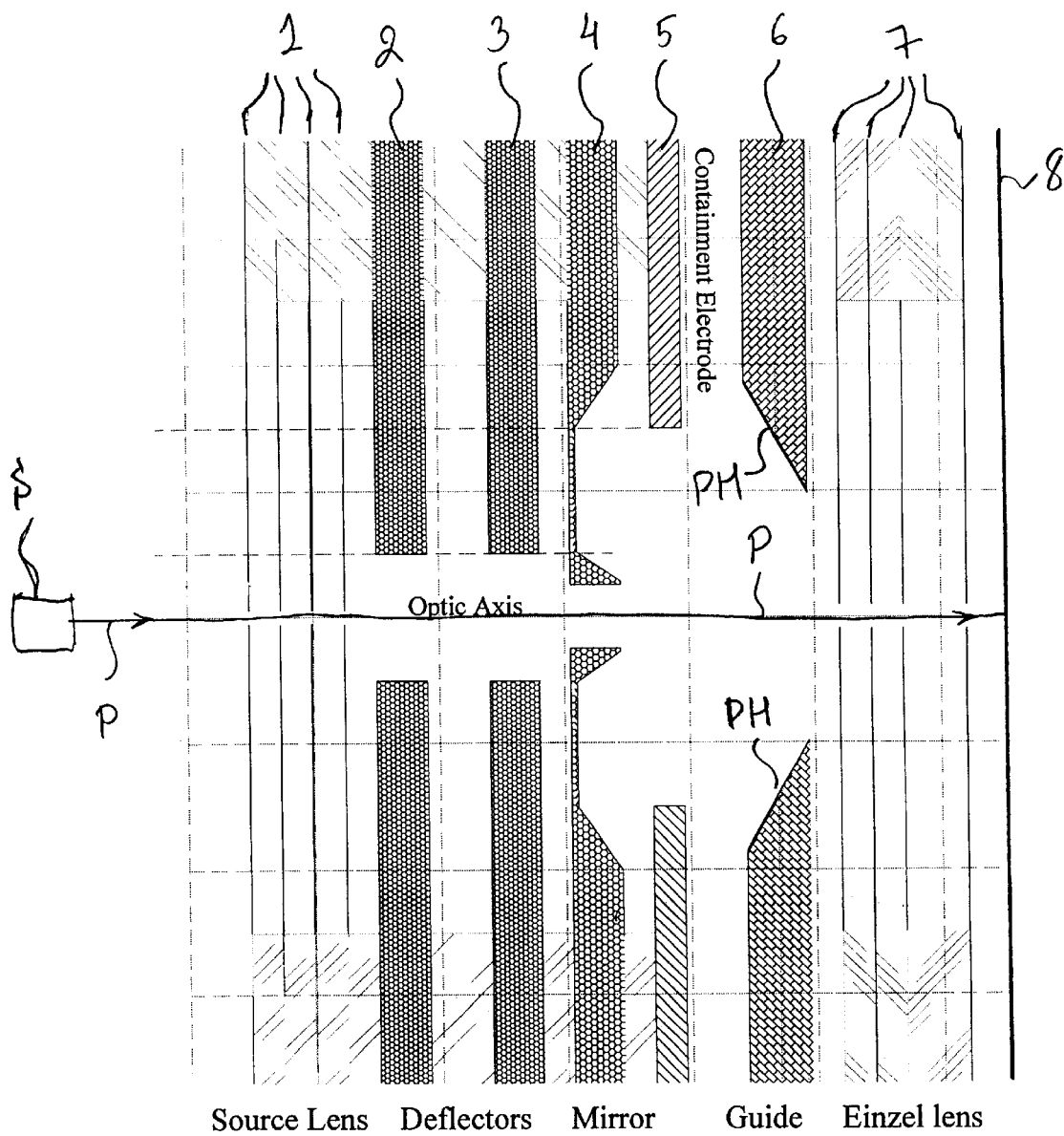
FIG. 1 shows a schematic diagram of a charged particle beam apparatus using a 180 degree electron mirror.

Preferred embodiments of the invention will now be described with reference to the attached drawings, wherein identical elements are designated with like numerals.

One difference between the inventive electron detection scheme based on the use of an electron mirror and the conventional indirect electron detection scheme described above is that the electron mirror reverses the direction of the electron beam emitted from the specimen. Generally, an electron mirror is an arrangement of one or more electrodes biased such that the electric field created by the mirror substantially alters the trajectories of charged particles passing through the electric field of the mirror.

Electron mirrors are well known in the art and have been used for many years to improve the quality of charged particle optical systems. The vast majority of these efforts have been applied to improving the quality of the primary electron beam. The inventive use of the electron mirror in a charged particle beam apparatus provides for higher electron landing energies on the detector (important for sufficient gain process with many detector types) and aberration correction in the secondary electron beam (important for time of flight dispersion and good overall secondary electron collection).

The inventive charged particle beam apparatus comprises a primary electron beam source and transport system for providing a primary electron beam for specimen illumination. The specimen can be an object of any kind, including semiconductor wafers and microphotolithography reticles used in semiconductor manufacture. The primary beam source and transport system includes, among other components, a set of source electron lenses and a pair of electron deflectors, all disposed upstream (with respect to the primary electron beam) of the charged particle beam apparatus. In order to acquire information about fine details of the specimen's structure, the primary electron beam of the charged particle beam apparatus should have a substantially small cross-section diameter, preferably a few tens of nanometers. To this end, the illuminating primary electron beam is focused on the specimen using a set of focusing electrostatic electron lenses.

Secondary and backscattered electrons emitted by the specimen as the result of irradiation with the primary electron beam are collected using an electron detector. The present invention uses electron mirrors to reverse the direction of the motion of the secondary electron beam emitted from the specimen and direct the secondary electrons away from the optical axis of the apparatus towards the electron detector. To this end, a negative potential with respect to the potential of the specimen is applied to the surface of the electrostatic mirror.

Various types of detectors, well known in the art and available commercially, can be used in the inventive apparatus for detecting the secondary electrons emitted by the specimen. For example, a microchannel plate detector (MCP), or a solid state detector can be used. Another type of electron detector that can be used in the inventive apparatus is a lightguide, having a layer of fluorescent material, preferably phosphor, deposited onto one of its polished ends. The other end of the lightguide should be optically coupled with a suitable photon detector.

In addition to altering the trajectories of the secondary and backscattered electrons, the electron mirror provides for higher landing energies of these electrons on the surface of the electron detector. The electron mirror also compensates for the results of the spherical and chromatic aberration effects in the secondary electron beam. In particular, the spherical aberration is caused by radial non-uniformity of the electric field in the particle beam apparatus. It results in the spread of the focusing locations of the electrons leaving the specimen at different angles. On the other hand, the chromatic aberration causes the secondary electrons with different initial energies to focus at different locations along the optical axis. Accordingly, both the spherical and the chromatic aberration cause the secondary electrons to strike different areas of the electron detector. The electron mirror can be designed to compensate for the aforementioned non-uniformity of the electric field. Accordingly, the use of the electron mirror can compensate for the results of both the spherical and chromatic aberration of the electron beam in the electric field of the particle beam apparatus.

It should be noted that the signal amplification, also called detector gain, and consequently the detection efficiency of many types of electron detectors vary considerably with the energy of the electrons striking the detector. Typically, to be detected, electrons must have kinetic energies above a certain threshold kinetic energy. Therefore, accelerating secondary electrons is important for efficient electron detection with many detector types.

Electron mirrors are also known to provide for correction of both spherical and chromatic aberration of electron beams. The aberration correction is important for improving the time of flight dispersion of the detected electrons and achieving a good overall secondary electron collection. Because the secondary electrons emitted from the specimen leave the latter with a wide range of initial kinematic parameters (the range of angles of the emission direction can cover the full $2\pi$ solid angle (the electrons can be emitted in the entire upper hemisphere), and the initial energy can vary over a range from near zero to several hundred eV depending upon surface charging conditions), the design of an efficient electron optic collection system is challenging. Typical designs of electron detectors collect merely a subset of the emitted electrons. Such subsets include secondary electrons with initial energies at the specimen in the range between zero and 50 eV and backscattered electrons with initial energies above 50 eV. The inventive electron mirror design can efficiently collect electrons in both the secondary and backscattered portions of the electron spectra over a wide range of initial angles.

It will be also appreciated by those of skill in the art that the mirror can be tuned to accept or reject secondary and backscattered electrons having their initial kinematic parameters within predetermined ranges. For example, in a system wherein the electrostatic mirror is set at a significant negative potential, the less energetic secondary electrons emitted by the specimen will not reach the electron detector. Similarly, the configuration of the electrodes and voltages of the mirror can be used for restricting the detection to only to those electrons, which leave the specimen at an angle within a predetermined angular range. Accordingly, the mirror may be used to effectuate the detection of only electrons with initial kinematic parameters within desired parameter ranges.

Even if a conventional design were to efficiently collect emitted electrons over a wide range of initial energies, a mirror design would still be superior in terms of time of flight dispersion. As discussed above, in high speed systems or systems with physically long electron transit distances, the relative differences in initial energies of the secondary electrons emitted from the specimen are important. A slow electron may not contribute to the same pixel as a fast electron due to its longer travel time from the specimen to the detector. An electron mirror can correct this time of flight dispersion because the faster electrons penetrate more deeply into the mirror field than do the slower electrons. This allows the electrons with lower initial kinetic energies to effectively catch up to the faster ones. Studies of time of flight dispersion in microcolumns indicate that using the inventive electron mirror detection scheme provides more than an order of magnitude improvement over the conventional direct detection methods. The mirror design also provides for off-axis landing position of the electrons emitted from the specimen. Once the electrons are deflected away from the optical axis of the apparatus, high landing energies on the detector can be achieved.

Specific embodiments of the invention will now be described.

An embodiment of the invention shown in FIG. 1 uses a 180 degree electron mirror 4 to assist in the collection and acceleration of secondary electron emitted from the specimen. This design embodies the above described detection scheme wherein an electrostatic electron mirror 4 is employed to redirect electrons emitted from a specimen onto the active area of an unshielded electron detector comprising a light guide 6 coated with a layer of phosphorous material PH. FIG. 1 is a scale cross section drawing of a microcolumn designed for use with such a detector. With reference to FIG. 1, the specimen 8 is irradiated by a primary electron beam P produced by an electron source S. The beam P passes along the optical axis of the apparatus and is focused on the specimen using a set of electron lenses 7.

Figure 2:
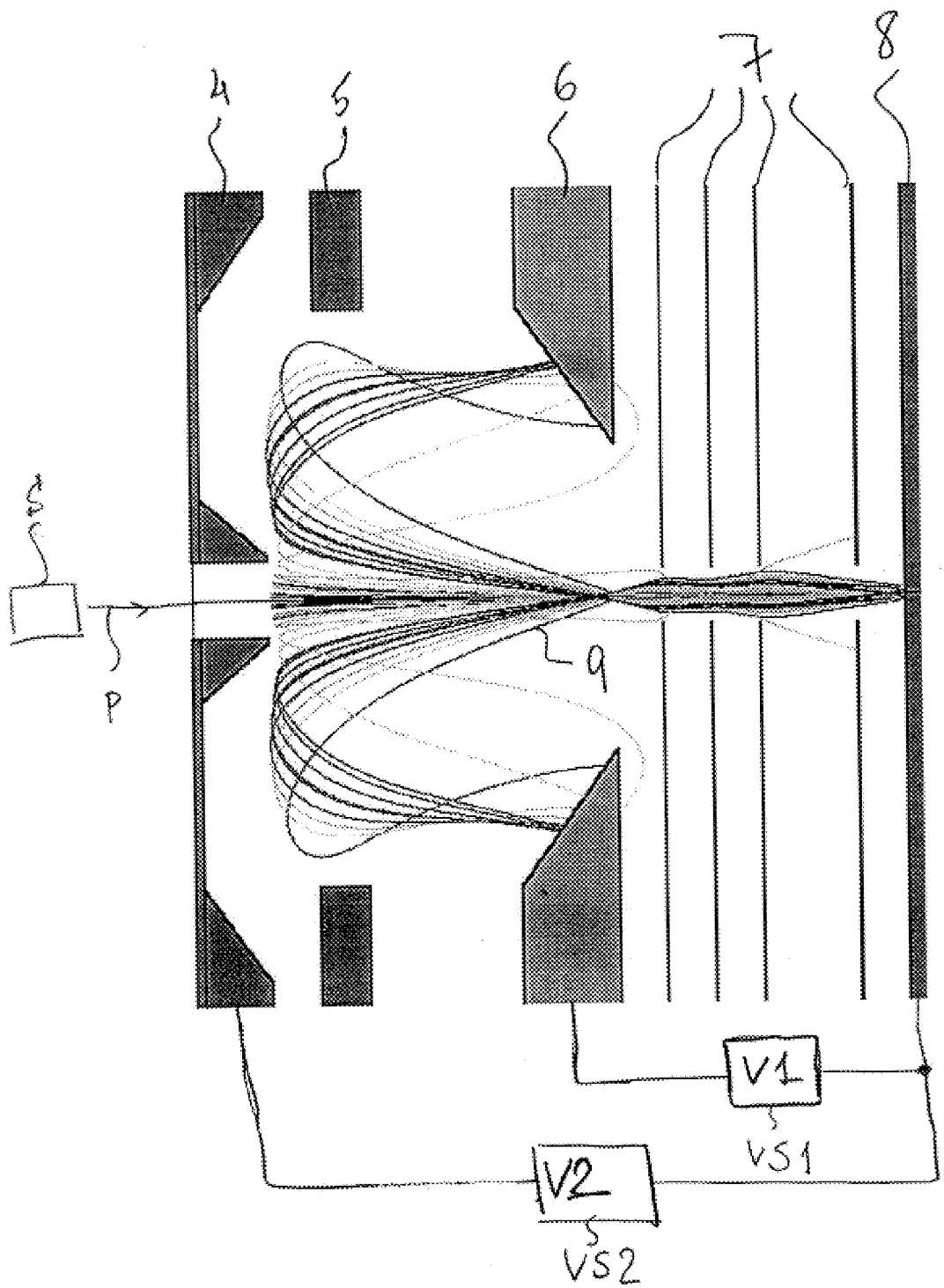
FIG. 2 shows simulated trajectories of secondary and backscattered electrons in a charged particle beam apparatus using a 180 degree electron mirror.

FIG. 2 depicts simulated trajectories of secondary and backscattered electrons 9 emitted from the specimen 8 as the result of its irradiation with the primary electron beam P. These emitted electrons are accelerated in the electric field of the particle beam apparatus towards the electron mirror 4. The design and type of electron mirror 4 that achieves the acceleration of the electrons 9 emitted from the specimen is not critical to the invention, as long as some fraction of the emitted electrons 9 reaches the mirror field. Once entering the mirror field, the electrons 9 are returned nearly 180 degrees toward the active area of the lightguide portion 6 of the electron detector. A containment electrode 5 disposed downstream of the mirror serves to control the size of the electrons' landing area on the lightguide 6. Controlling the size of the electrons' landing area is useful with respect to many detector types for lifetime considerations. The use of the containment electrode 5 is not critical to the invention.

Light generated due to the interaction of the secondary electrons emitted from the specimen with the phosphor deposited on the surface of the lightguide 6 is transmitted to photocathode (not shown) for conversion back into an electrical signal. This electrical signal is subsequently amplified. The use of other detector types including MCP and solid state detectors is also possible with this design. Other components of the embodiment shown in FIG. 1 include the aforementioned electrostatic electron lenses 7, and the primary beam deflectors 2 and 3. The primary beam deflectors have an opening in a central portion thereof for the passage of the primary electron beam. Preferably, the diameter of this opening is in the range 0.5 to 2 mm. The electron mirror and the containment electrode also comprise such a primary beam passage opening. The diameter of the opening is preferably in the range 0.1 to 2.0 mm for the electron mirror and 0.5 to 3.0 mm for the containment electrode. Those of skill in the art will readily appreciate that the actual diameters may vary over a substantially large range depending on the primary electron beam requirements. Designs of this type wherein the primary and secondary electrons are not shielded from the influence of the electric field created by the accelerating potential applied to the active surface of the electron detector 6 may be used in low energy electron beam columns, so long as the landing energy requirements of the detector 6 are not very much higher than the kinetic energy of the primary beam. For instance, the embodiment shown in FIG. 1 is a microcolumn designed for 1 keV primary beam energy and a detector landing energy of 1.5 keV. Those of skill in the art will appreciate that other primary electron beam energies can be also used. For example, the primary beam energy can be in the range of 0–2.5 keV. However, at higher landing energies shielding of the face of the detector 6 must be employed to prevent adverse effects of the aforementioned electric field on the primary beam.

For example, the biasing potentials can be applied to the components of the particle beam apparatus in a manner shown in FIG. 2. This figure shows a voltage source VS1 connected between the specimen 8 and the surface of the lightguide 6. The potential difference V1 created by this voltage source is responsible for accelerating the secondary and backscattered electrons before they strike the surface of the lightguide 6. It will be undoubtedly appreciated by those of skill in the art, that to achieve the aforementioned acceleration, the potential of the lightguide 6 should be positive with respect to the potential of the specimen 8.

On the other hand, the second voltage source VS2 generating the potential difference V2 applied between the specimen 8 and the electrostatic mirror 4 is responsible for reversing the electron trajectories and directing the electrons towards the light guide portion of the electron detector 6. It will be clear to persons skilled in the art that in the exemplified configuration, the potential of the electrostatic mirror 4 should be negative with respect to the potential of the specimen 8.

Figure 3:
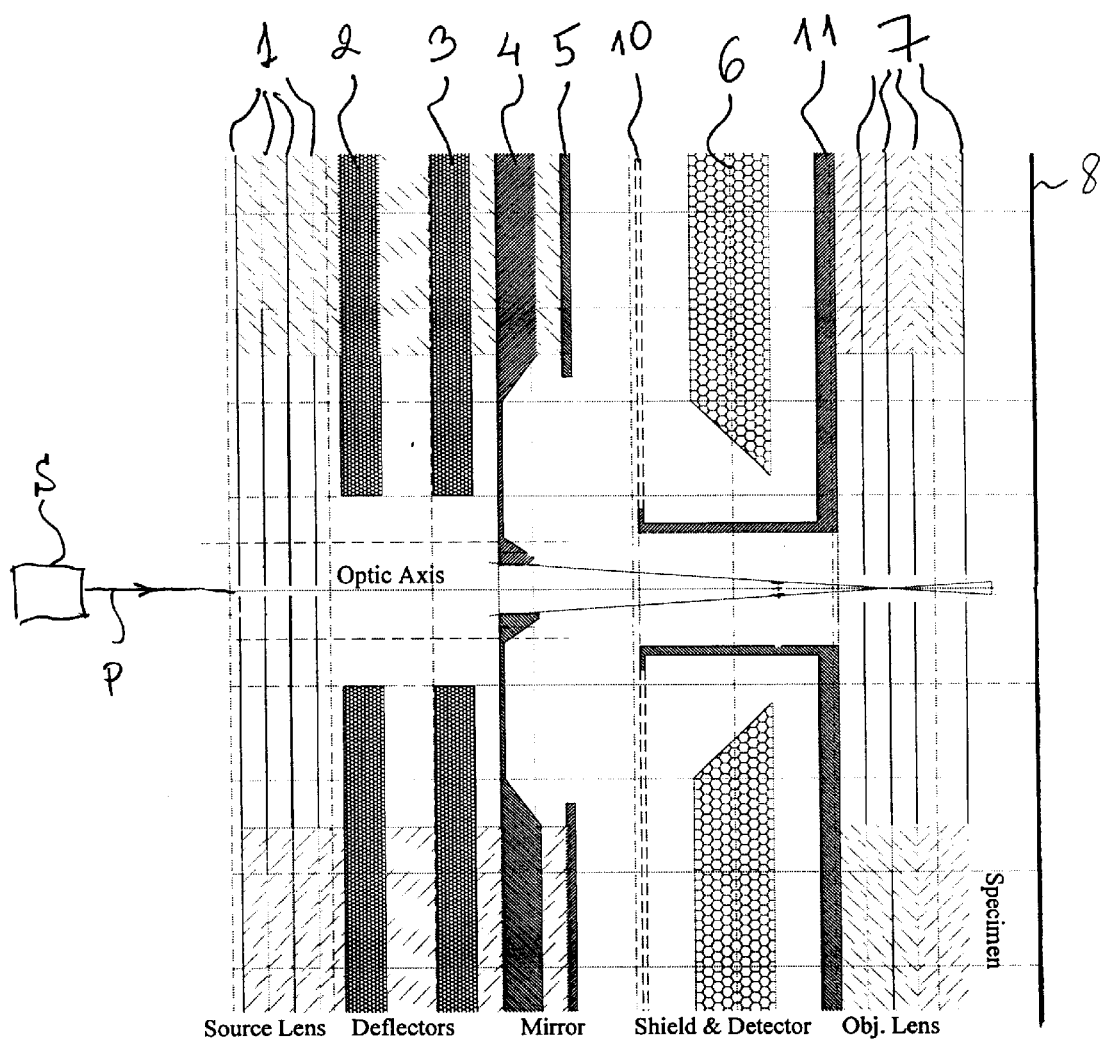
FIG. 3 shows a schematic diagram of a charged particle beam apparatus using a 180 degree electron mirror and a primary beam shield.

Another embodiment of the invention shown in FIG. 3 uses a 180 degree electron mirror 4 in combination with a primary beam shield and detector housing 11 to assist in the collection of electrons emitted from a specimen when the landing energy requirements of the detector 6 prohibit an unshielded design of FIG. 1.

The use and design of the primary beam shield and detector housing 11 are well known in the art. Many commercially available electron beam tools use shielded detector designs with various types of electron detectors. In low energy electron beam columns, it is difficult to achieve high electron landing energies on the active area of the detector if the detector position is near the optical axis of the apparatus. This is so because the primary electrons traveling along the optical axis of the apparatus pass through the electric field near the electron detector, which is used to accelerate the secondary and backscattered electrons. The influence of this electric field deteriorates the characteristics of the primary electron beam. Accordingly, some type of electrostatic shield must be employed to prevent adverse effects on the primary beam of the electric field, which is used for accelerating the secondary electrons. The embodiment of the invention shown in FIG. 3 combines the electrostatic mirror 4 and primary beam shield and detector housing 11 to capitalize on the aforementioned advantages provided by electrostatic mirrors in systems using electron detectors that require high landing energies, such as solid state or scintillation type detectors.

In the embodiment of the inventive charged particle beam apparatus shown in FIG. 3, the primary beam shield and detector housing 11 and a grid structure 10 are introduced surrounding the active area of the detector 6 in order to shield the latter from the influence of the electric field of the electrostatic mirror. The primary beam shield and detector housing 11 also serves to shield the primary electron beam from the electric fields inside the apparatus. Preferably, the inner diameter of the primary beam shield and detector housing 11 is in the range 0.5 to 2.5 mm, and its length is in the range 1.0 to 4.0 mm. The primary beam shield and detector housing 11 is preferably disposed within 1.0 to 5.0 mm downstream of the electron mirror 4. Other components of the embodiment shown in FIG. 3 and their dimensions are substantially the same as in the embodiment shown in FIG. 1. In the shown embodiment, the electron detector 6 is a scintillator. Arbitrarily high landing energies can be achieved in this design so long as the structure is designed to withstand the potential differences applied. Scintillation materials and solid state detectors typically require landing energies greater than 3 keV, prohibiting their usage in low voltage column designs such as shown in FIG. 1. If a positive potential of 3 kV with respect to the potential of the specimen were to be applied to the face of the light guide 6 in FIG. 1, the primary beam would be adversely affected and the secondary electron beam would be refocused towards the optic axis after leaving the mirror field, which reduces the collection efficiency.

Figure 4:
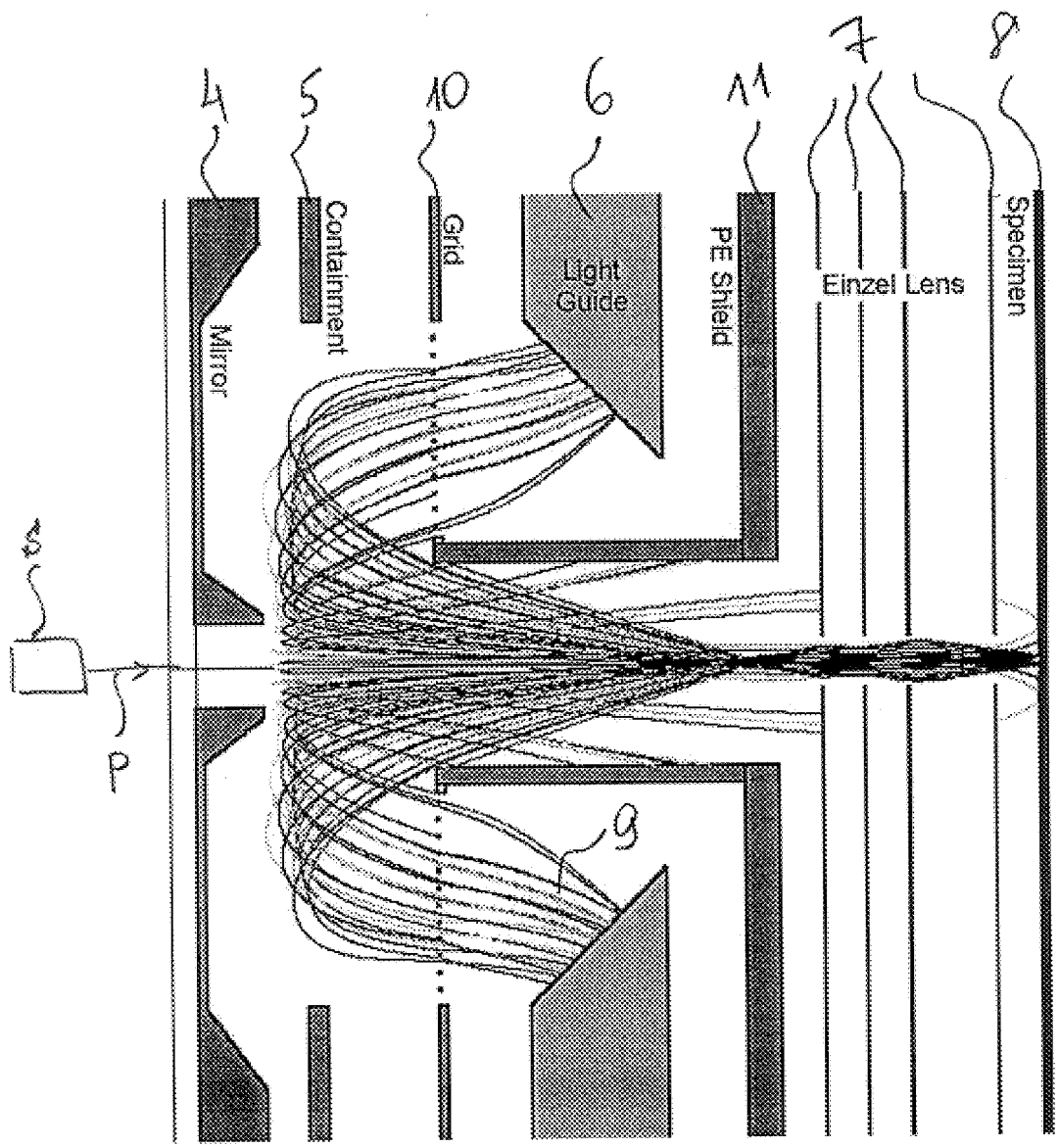
FIG. 4 shows simulated trajectories of secondary and backscattered electrons in a charged particle beam apparatus using a 180 degree electron mirror and a primary beam shield.

FIG. 4 shows results of electron trajectory simulation corresponding to the column design shown in FIG. 3. The shown simulation results confirm high efficiency of the secondary electron detection in this design.

Figure 5:
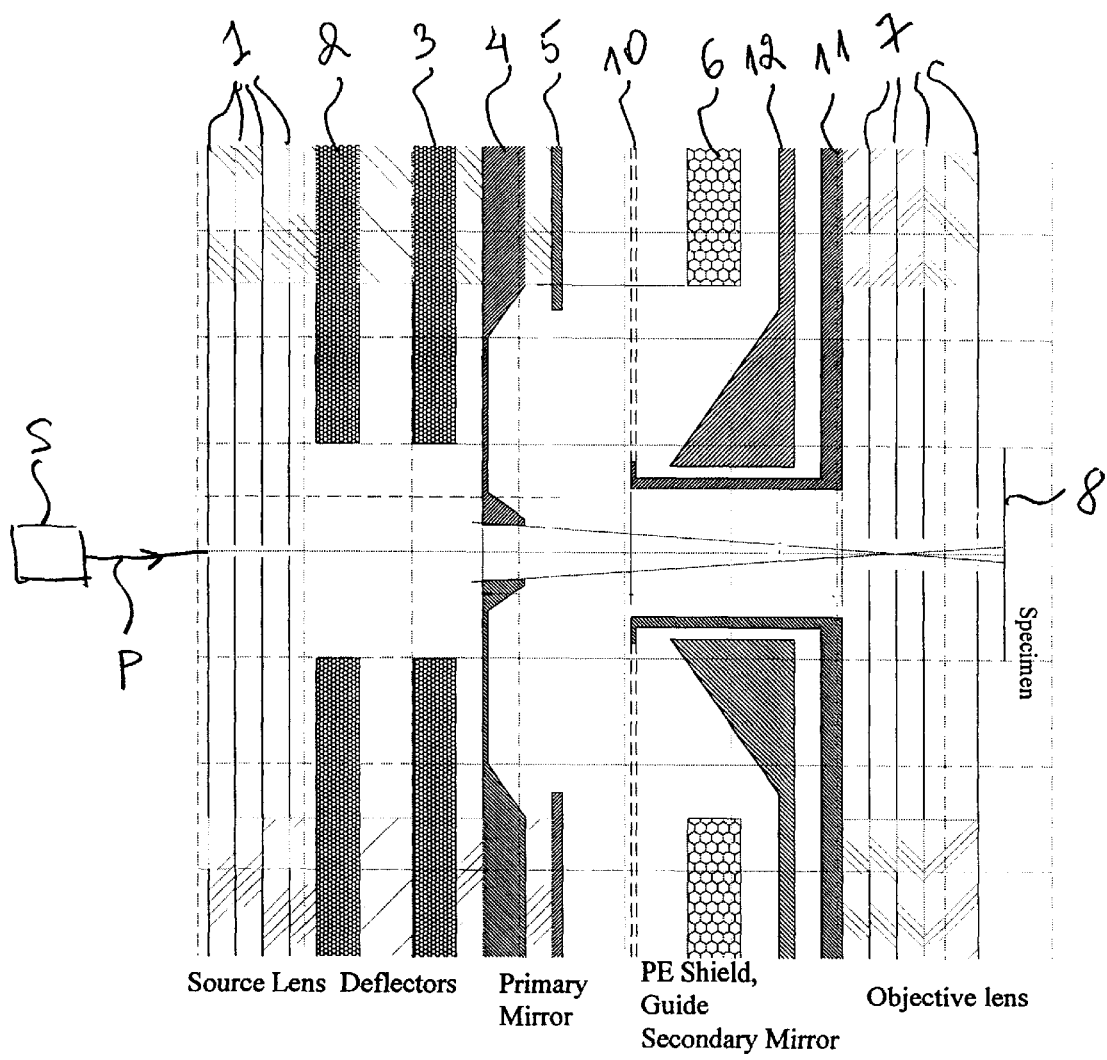
FIG. 5 shows a schematic diagram of a charged particle beam apparatus using a 180 degree electron mirror and a 90 degree electron mirror.
Figure 6:
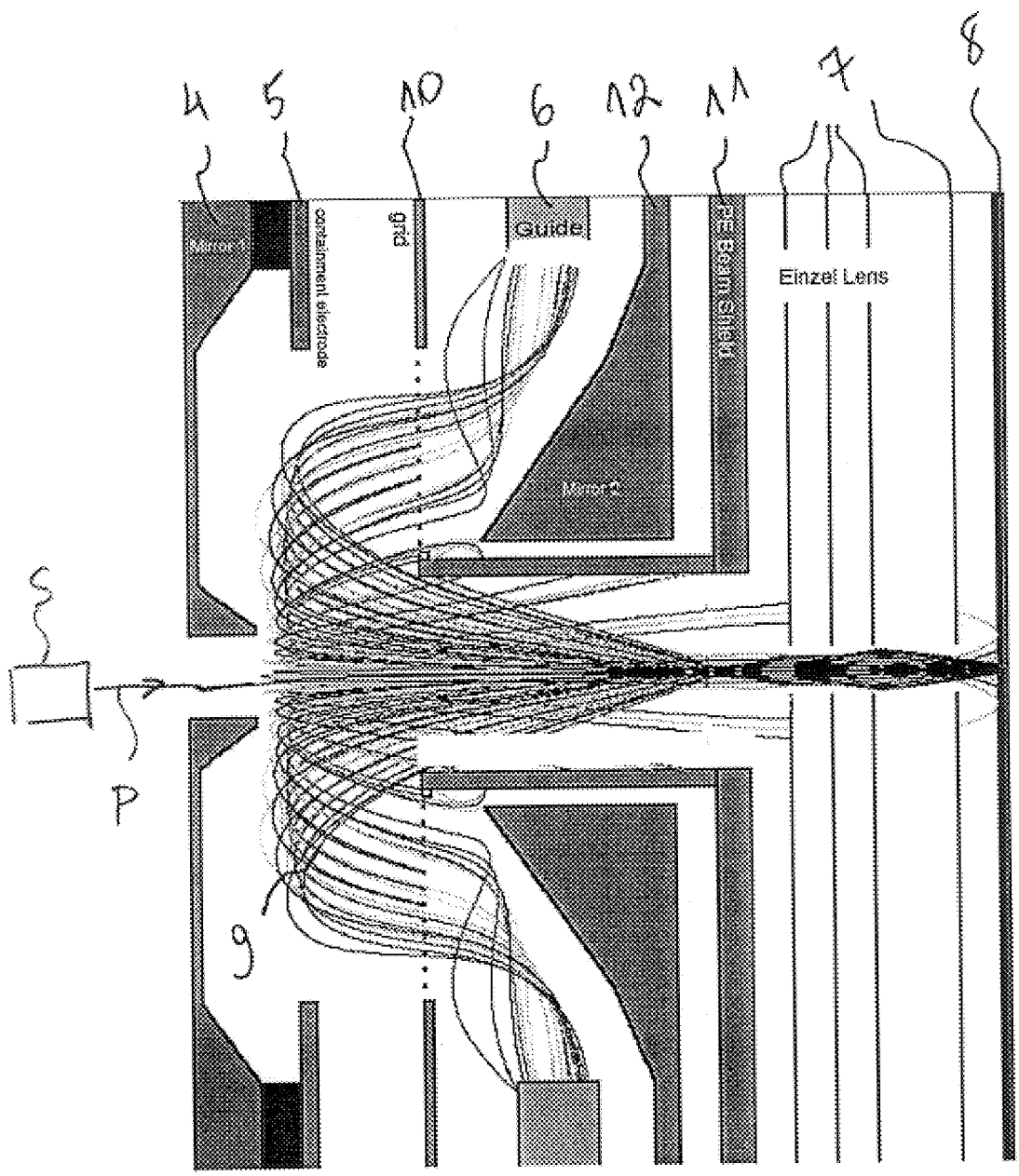
FIG. 6 shows simulated trajectories of secondary and backscattered electrons in a charged particle beam apparatus using a 180 degree electron mirror and a 90 degree electron mirror.

A further embodiment of the invention shown in FIG. 5 uses a 180 degree electron mirror 4 in combination with a 90 degree electron mirror 12 to assist in the collection of electrons emitted from a specimen and to control the direction of the electrons' landing on the face of the electron detector 6. FIG. 6 shows simulated secondary electron trajectories 9 for this embodiment.

Some types of electron detectors are more efficient if bombarding electrons strike the active area of the detector at a particular angle. For instance, in phosphor and scintillator type electron detectors, electrons strike a material, which generates photons. The produced photons are transmitted by a light guide to a photo-cathode for amplification and conversion back to an electrical signal. Efficient transmission of the produced photons through the light guide typically requires that the luminescent material be placed directly onto the surface of the end of the light guide. For greater efficiency, the electrons exciting this luminescent material should land nearly perpendicular to the surface of the end of the guide.

The embodiment of the invention shown in FIG. 5 is similar to the embodiment shown in FIG. 3, with the exception of a 90 degree electrostatic mirror 12 added inside the primary beam shield and detector housing 11. The 90 degree mirror 12 provides for a perpendicular landing of electrons onto the face of the electron detector 6. In the design shown, the electron detector comprises a phosphor material deposited on the face of a transmitting light guide. Higher photon collection can be achieved with this design compared to the tapered light guide designs shown in FIGS. 1 and 3. Preferably, the face of the electron detector 6 is disposed within 2.0–5.0 mm from the optical axis of the apparatus.

Figure 7:
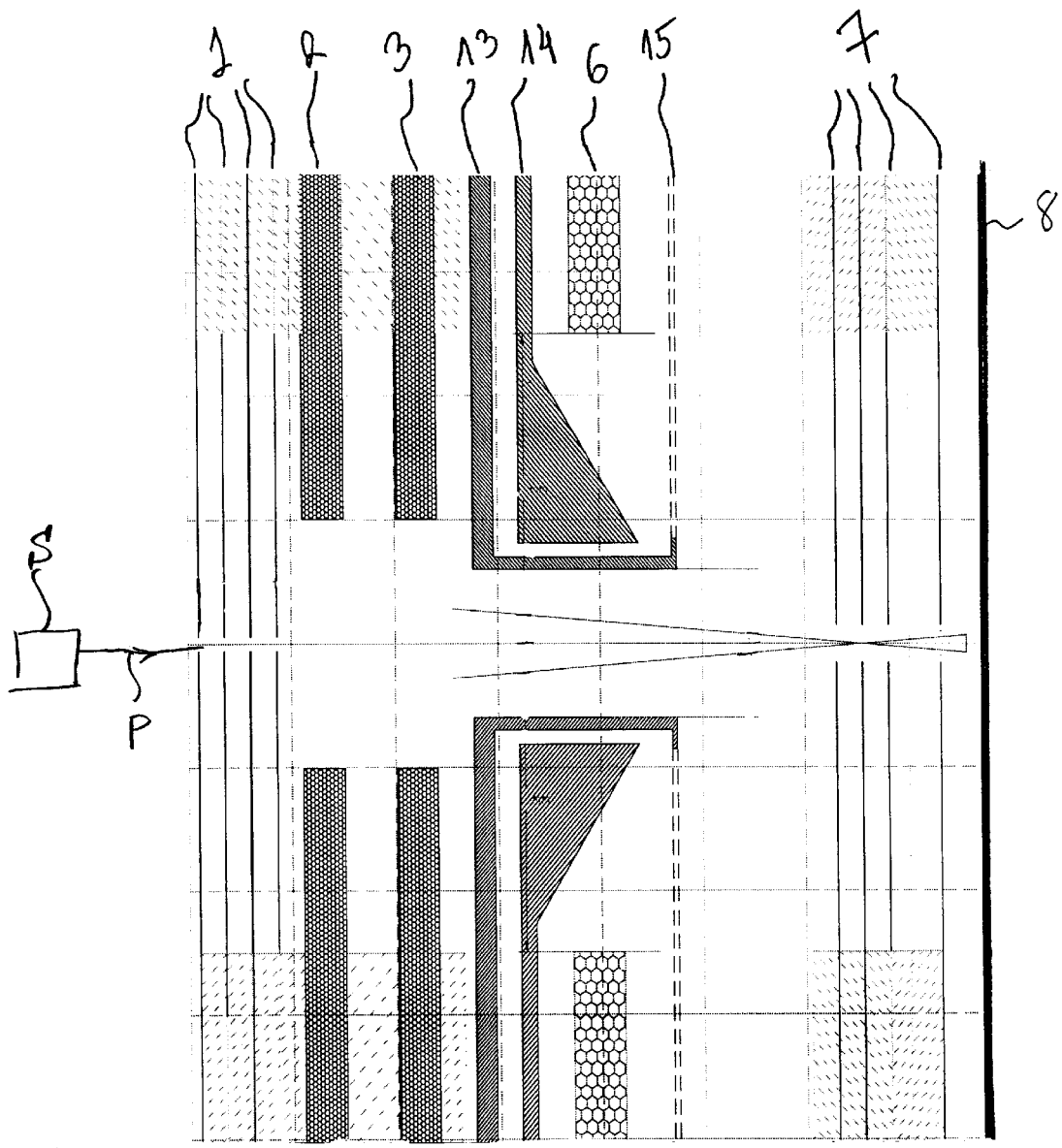
FIG. 7 shows a schematic diagram of a charged particle beam apparatus using a shield and grid, with internal mirror fiber light guide in a face down position.
Figure 8:
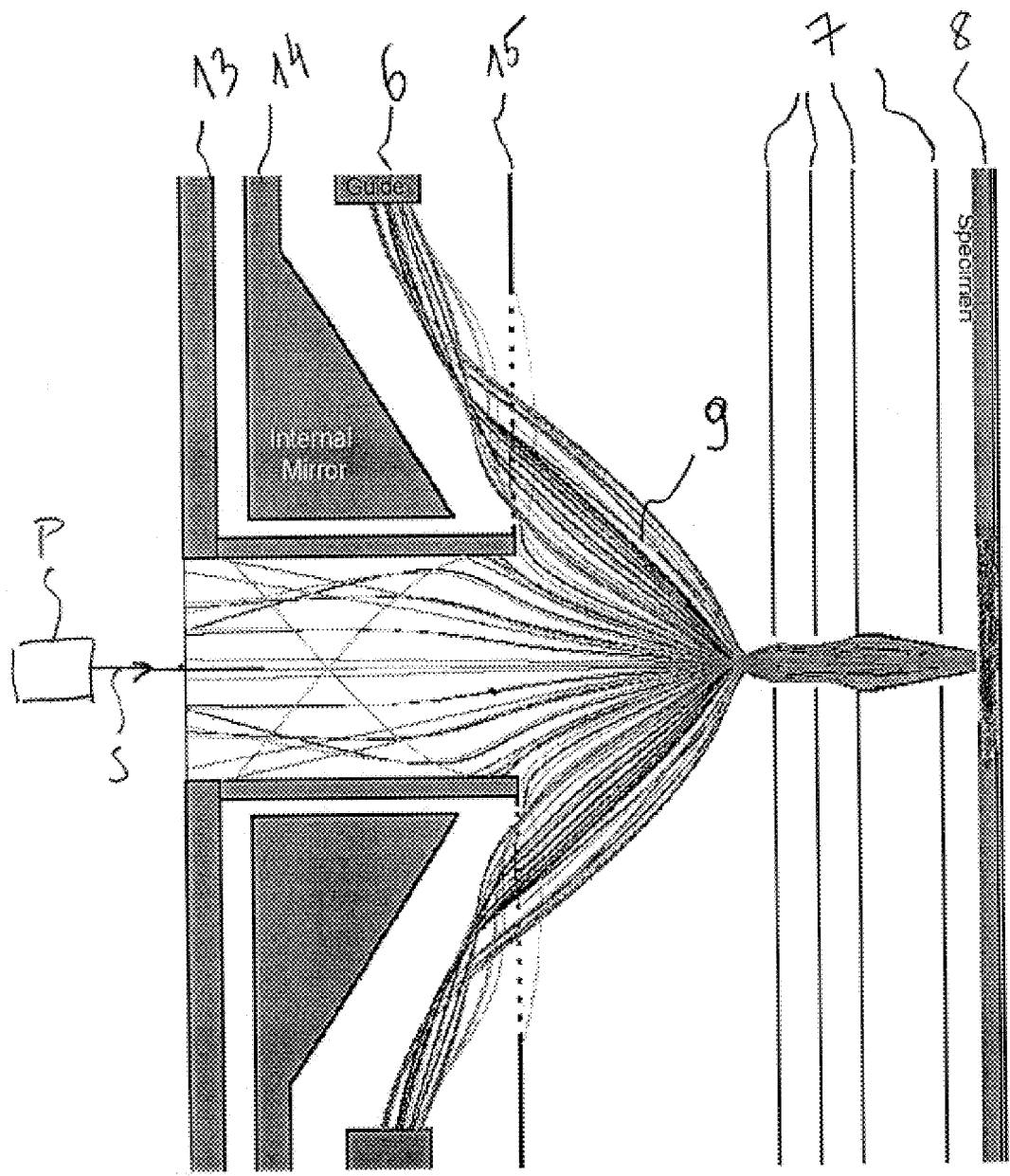
FIG. 8 shows simulated trajectories of secondary and backscattered electrons in a charged particle beam apparatus using a shield and grid, with internal mirror fiber light guide face down position.

In yet another embodiment of the invention shown in FIG. 7, the active area of the electron detector 6 faces the specimen 8. Therefore, this configuration is referred to as a "face down" configuration. The primary beam shield housing 13, 15 contains an internal electrostatic electrode 14 that serves as a 90 degree electron mirror. The region between the final electrostatic lens 7 in the column and the detector housing 13, 15 is nearly field free, allowing for the secondary electrons that are emitted from the specimen to experience a cross over just after leaving the lens field. The secondary electrons 9, whose simulated trajectories are shown in FIG. 8, traverse the region between the detector 6 and the lens 7 and are reflected approximately 90 degrees toward the active area of the detector 6. In this embodiment, the dimensions of the internal mirror 14 are approximately the same as in the face up version shown in FIG. 5.

FIG. 8 shows the trajectory simulations of the secondary and backscattered electrons emitted from the specimen 8. As can be seen from this drawing, a substantial portion of the secondary and backscattered electrons 9 emitted from the specimen 8 are directed away from the optical axis of the apparatus, towards the surface of the electron detector 6.

While the invention has been described herein using preferred embodiments thereof, it will be readily appreciated by those skilled in the art that various modifications in form and detail may be made therein without departing from the scope and spirit of the invention, as defined in and by the appended claims. For example, while the figures described above show various microcolumn designs, the invention is not so limited. The inventive mirror concept can also be employed in other kinds of columns, as well as in any other article imaging systems which utilize particle beams.

What is claimed is:

1. A method for imaging a specimen in a charged particle beam apparatus, said method comprising:
   (a) inducing said specimen to emit electrons;
   (b) deflecting said emitted electrons using an electron mirror; and
   (c) using said deflected emitted electrons to create an image of said specimen.

2. The method of claim 1, wherein said emitted electrons in said (b) comprise secondary electrons and said image is indicative of a topographic structure of said specimen.

3. The method of claim 1, wherein said emitted electrons in said (b) comprise backscattered electrons and said image is indicative of a material structure of said specimen.

4. The method of claim 1, wherein said (b) comprises using a 180 degree electrostatic mirror as said electron mirror.

5. The method of claim 1, wherein said (b) comprises accelerating said emitted electrons using said electron mirror.

6. The method of claim 1, wherein said (b) comprises correcting a spherical aberration of said emitted electrons using said electron mirror.

7. The method of claim 1, wherein said (b) comprises correcting a chromatic aberration of said emitted electrons using said electron mirror.

8. The method of claim 1, wherein said (b) comprises reducing a time-off-flight dispersion of said emitted electrons using said electron mirror.

9. The method of claim 1, wherein said (a) comprises irradiating said specimen with a primary electron beam.

10. The method of claim 9, wherein said (a) further comprises focusing said primary electron beam on said specimen using a plurality of electrostatic electron lenses.

11. The method of claim 9, wherein said (a) further comprises shielding said primary electron beam and said emitted electrons using a primary beam shield.

12. The method of claim 1, wherein said (c) comprises detecting said emitted electrons using an electron detector.

13. The method of claim 12, wherein said electron detector is a multichannel plate detector.

14. The method of claim 12, wherein said electron detector is a scintillating detector.

15. The method of claim 12, further comprising (d) providing a second electron mirror for controlling a direction of landing of said emitted electrons on a surface of said electron detector.

16. The method of claim 15, wherein said (d) comprises using a 90 degree electrostatic mirror as said second electron mirror.

17. The method of claim 1, wherein said specimen is a semiconductor wafer and wherein said image is used to inspect said wafer for manufacturing defects.

18. The method of claim 1, wherein said specimen is a reticle and wherein said image is used to inspect said reticle for manufacturing defects.

19. A charged particle beam apparatus for imaging a specimen, said apparatus comprising:
   (a) an electron beam generation and transport system for providing a primary electron beam; said primary electron beam irradiating said specimen and inducing said specimen to emit electrons;
   (b) an electron mirror for deflecting said emitted electrons; and
   (c) an electron detector for detecting said deflected emitted electrons to create an image of said specimen.

20. The apparatus of claim 19, wherein said electron mirror is a 180 degree electrostatic mirror.

21. The apparatus of claim 19, wherein said electron detector and said electron mirror are biased to provide an acceleration of said emitted electrons before their detection by said electron detector.

22. The apparatus of claim 19, wherein said electron mirror corrects a spherical aberration of said emitted electrons.

23. The apparatus of claim 19, wherein said electron mirror corrects a chromatic aberration of said emitted electrons.

24. The apparatus of claim 19, wherein said electron mirror reduces a time-of-flight dispersion of said emitted electrons.

25. The apparatus of claim 19, wherein said electron beam generation and transport system comprises a plurality of electrostatic electron lenses for focusing said primary electron beam on said specimen.

26. The apparatus of claim 19, wherein said electron detector is a multichannel plate detector.

27. The apparatus of claim 19, wherein said electron detector is a scintillating detector.

28. The apparatus of claim 19, wherein said electron detector comprises a light guide, an end of said light guide being coated with a scintillating material.

29. The apparatus of claim 19, wherein said electron beam generation and transport system comprises a primary beam shield for shielding said primary electron beam and said emitted electrons.

30. The apparatus of claim 19, further comprising (d) a second electron mirror for controlling a direction of landing of said emitted electrons on a surface of said electron detector.

31. The apparatus of claim 30, wherein said second electron mirror is a 90 degree electrostatic mirror.

32. The apparatus of claim 19, wherein said specimen is a semiconductor wafer and wherein said apparatus further comprises (d) an image analysis unit for inspecting said semiconductor wafer for manufacturing defects using said image.

33. The apparatus of claim 19, wherein said specimen is a reticle and wherein said apparatus further comprises (d) an image analysis unit for inspecting said reticle for manufacturing defects using said image.

34. The apparatus of claim 19, wherein an active area of said electron detector faces in a direction away from said specimen.

35. The apparatus of claim 19, wherein an active area of said electron detector faces said specimen.

36. The apparatus of claim 35, wherein said electron mirror is a 90 degree electron mirror.

* * * * *